(12) United States Patent
Roll et al.

(10) Patent No.: US 9,377,222 B2
(45) Date of Patent: Jun. 28, 2016

(54) THERMOELECTRIC TEMPERATURE CONTROL UNIT

(71) Applicant: Mahle International GmbH, Stuttgart (DE)

(72) Inventors: Peter Roll, Vaihingen (DE); Juergen Gruenwald, Ludwigsburg (DE); Holger Schroth, Maulbronn (DE); Florin Moldovan, Stuttgart (DE); Martin Steinbach, Waiblingen (DE)

(73) Assignee: Mahle International GmbH, Stuttgart (DE)

( * ) Notice: Subject to any disclaimer, the term of this patent is extended or adjusted under 35 U.S.C. 154(b) by 105 days.

(21) Appl. No.: 14/316,032

(22) Filed: Jun. 26, 2014

(65) Prior Publication Data
US 2015/0000307 A1  Jan. 1, 2015

(30) Foreign Application Priority Data

Jun. 27, 2013  (DE) .......................... 10 2013 212 511

(51) Int. Cl.
  *F25B 21/02*  (2006.01)
  *H01L 35/32*  (2006.01)

(52) U.S. Cl.
  CPC ........... *F25B 21/02* (2013.01); *F25B 2321/023* (2013.01); *F25B 2321/025* (2013.01); *F25B 2321/0212* (2013.01); *F25B 2500/06* (2013.01); *H01L 35/32* (2013.01)

(58) Field of Classification Search
  CPC ................. F25B 21/02; F25B 2321/02; F25B 2321/0212; F25B 2321/025; H01L 35/32
  See application file for complete search history.

(56) References Cited

U.S. PATENT DOCUMENTS

| 4,107,934 | A | 8/1978 | Beitner | |
|---|---|---|---|---|
| 6,347,521 | B1* | 2/2002 | Kadotani | F25B 21/02 136/204 |
| 2003/0172657 | A1 | 9/2003 | Ohkubo et al. | |
| 2011/0100406 | A1* | 5/2011 | Danenberg | H01L 35/32 136/203 |
| 2011/0235165 | A1* | 9/2011 | Sugimoto | G02B 6/02042 359/341.3 |
| 2013/0239591 | A1* | 9/2013 | Clarkson | F25B 21/02 62/3.7 |
| 2014/0260334 | A1* | 9/2014 | Savelli | H01L 35/06 62/3.7 |

FOREIGN PATENT DOCUMENTS

| DE | 1 539 324 A1 | 11/1969 |
|---|---|---|
| DE | 27 32 321 A1 | 2/1978 |
| DE | 101 96 995 B4 | 10/2005 |

* cited by examiner

*Primary Examiner* — Daniel Rohrhoff
(74) *Attorney, Agent, or Firm* — Muncy, Geissler, Olds & Lowe, P.C.

(57) ABSTRACT

A thermoelectric temperature control unit with a first Peltier element and a second Peltier element, each of which has a first surface and a second surface, whereby the first surface is arranged adjacent or opposite to the second surface, whereby the Peltier elements are each connected with the first surface to a first cover plate and are connected with the respective second surface to a second cover plate, whereby heat can be supplied at least via one of the cover plates and heat can be removed via the other cover plate, whereby the first and/or the second cover plate have an expansion joint and/or a spring structure.

14 Claims, 4 Drawing Sheets

THERMOELECTRIC TEMPERATURE CONTROL UNIT

This nonprovisional application claims priority under 35 U.S.C. §119(a) to German Patent Application No. 10 2013 212 511.9, which was filed in Germany on Jun. 27, 2013, and which is herein incorporated by reference.

BACKGROUND OF THE INVENTION

1. Field of the Invention

The invention relates to a thermoelectric temperature control unit with a first Peltier element and a second Peltier element, each of which has a first surface and a second surface, whereby the first surface is arranged adjacent or opposite to the second surface, whereby the Peltier elements are each connected with the first surface to a first cover plate and are connected with the respective second surface to a second cover plate, whereby heat can be supplied at least via one of the cover plates and heat can be removed via the other cover plate.

2. Description of the Background Art

Motor vehicles with electric additional drives or fully electric drives generally require electrical energy storage devices. Electrical energy can be temporarily stored and kept available in these energy storage devices.

Depending on the operating situation and ambient conditions, these energy storage devices must be heated or cooled. This is especially necessary in order to always keep the energy storage devices within a defined temperature window in which they operate optimally. Too high temperatures in particular can lead to damage and premature aging of the energy storage devices. Too low temperatures have a negative effect on performance.

Temperature control units are known in the conventional art which function with the use of the thermoelectric properties of Peltier elements. In this regard, Peltier elements either generate a temperature difference at two of their interfaces based on an applied voltage or generate an electrical voltage based on an existing temperature difference.

In each case the Peltier elements have a side with a high temperature level and a side with a lower temperature level in relative terms. Thermal stresses, which can lead to damage to the thermoelectric temperature control unit, arise within the thermoelectric temperature control unit based on this different temperature level.

A disadvantage in the solutions in the conventional art is particularly that insufficient precautions are taken to prevent the occurrence of thermal stresses in the thermoelectric temperature control unit or at least to reduce these so far that no damage to the thermoelectric temperature control unit and particularly to the Peltier elements occurs.

SUMMARY OF THE INVENTION

It is therefore the object of the present invention to provide a thermoelectric temperature control unit suitable to reduce or prevent completely the occurrence or the negative effects of thermal stresses.

An exemplary embodiment of the invention relates to a thermoelectric temperature control unit with a first Peltier element and a second Peltier element, each of which has a first surface and a second surface, whereby the first surface is arranged adjacent or opposite to the second surface, whereby the Peltier elements are each connected with the first surface to a first cover plate and are connected with the respective second surface to a second cover plate, whereby heat can be supplied at least via one of the cover plates and heat can be removed via the other cover plate, whereby the first and/or the second cover plate have an expansion joint and/or a spring structure.

The Peltier elements can be made as rectangular bodies. In this regard, the first surface and second surface are two opposite areas. The Peltier elements are further electrically contacted in order to be able to produce either heating or cooling according to the intended purpose.

The Peltier elements can be fixedly connected to the cover plates. In this case, a flexible connecting layer can be provided between the Peltier elements and the cover plates, which layer serves to take up the thermal stresses arising during the operation of the thermoelectric temperature control unit. Such a flexible layer is not absolutely necessary, however. The Peltier elements can be connected to the cover plates also via a substantially rigid connection. The arising thermal stresses are then compensated primarily via the expansion joints, arranged in the cover plate, and the spring structures.

The expansion joints can be formed by cuts which divide the cover plate. In order to produce the greatest possible absorbing capacity for thermal stresses, which result in changes in length, it is advantageous if the expansion joints produce a complete separation of the cover plate in a number of areas.

The spring structures can be produced by an arrangement of a plurality of cuts. In this regard, the cover plate is not divided into a number of separated sections. The individual sections of the cover plates remain connected at all times via the individual spring webs created by the cuts.

The Peltier elements can be arranged spaced apart from one another between the cover plates.

The Peltier elements can be arranged spaced apart from one another. This serves particularly to produce a homogeneous temperature distribution across the cover plate.

The expansion joint and/or the spring structure in the first cover plate and/or the second cover plate can run outside the contact surfaces between the Peltier elements and the respective cover plate.

The arrangement of the expansion joints and/or the spring structures in an area of the cover plate that lies outside the contact surfaces between the Peltier elements and the respective cover plate is especially advantageous, because the so-called "thermal neutral fibers" of the cover plate are located in these areas. The neutral fibers are located in the middle between the points of the cover plate with the greatest heat input. The points or areas with the greatest heat input are therefore located in the areas of the contact surfaces between the Peltier elements and the cover plates.

The spring structure can be formed by an arrangement of a plurality of cuts in a cover plate, whereby at least one spring web is formed by the cuts.

The spring structure is especially simple to produce via a plurality of cuts. The cuts can be introduced into the cover plates by typical methods. The spring web formed by two cuts each represents a connecting member between adjacent areas of the cover plate. In this way, despite the great absorbing capacity of the spring structure for thermal stresses, the stability of the cover plate is only minimally affected.

Further, one of the cover plates can have a plurality of expansion joints and/or spring structures.

A plurality of expansion joints and/or spring structures is especially advantageous to produce a sufficiently great absorbing capacity for thermal stresses in a cover plate with a greater surface extension as well.

At least one of the cuts of the spring structure can be formed by an expansion joint.

This is especially advantageous in order to be able to form, despite an expansion joint running completely through the cover plate, a spring structure that extends over the greatest possible area and thereby is not interrupted by the course of the expansion joint.

A spring structure can be formed by a plurality of wave-like cuts, whereby the wave-like cuts are substantially point symmetric and are arranged with their symmetry point parallel to one another along a mutual straight line.

A wave-like cut is advantageous, because it produces a preferred shape for the spring web. In addition, a point symmetric design of the cuts prevents an undesirable compensatory movement of the spring webs toward the battery elements or away from the battery elements. Spring webs of uniform size are produced by a parallel arrangement of the cuts, which is especially conducive to a homogeneous absorption of the thermal stresses.

According to an embodiment of the invention, it may be provided that the expansion joints run parallel to one another and run at a right angle to the respective spring structures.

Also, one of the cover plates can be in thermal contact with at least one battery element, whereby the respective other cover plate is in thermal contact with a heat exchanger, whereby an actively temperature-controllable fluid can flow through the heat exchanger.

In this way, heat can be supplied to the battery elements by actively heating the fluid. The heat supplied to the battery elements is thereby the sum of the heat of the actively temperature-controlled fluid and the heat output of the Peltier elements. Alternatively, the battery elements can be cooled by transporting the heat from the battery elements via the Peltier elements to the fluid, whereby the heat is transported away by the fluid from the thermoelectric temperature control unit.

A cover plate can be divided into a plurality of sections by expansion joints arranged at a right angle to one another, whereby each Peltier element is connected to one each of the sections.

Such an arrangement represents the greatest possible decoupling of the individual areas from one another. In this way, the absorbing capacity for thermal stresses is at a maximum.

At least one expansion joint can be interrupted by a spring web of a spring structure, whereby two sections, arranged adjacent to one another, are connected to one another by the spring web.

An arrangement of spring webs such that cover plate sections adjacent to one another are connected is advantageous, because in this way no complicated alignment of the individual sections to one another need occur. The cover plate continues to be formed further by only one element. If the sections were not to be connected together by the spring webs, the production process would become more complex and cost-intensive because of the then necessary alignment of the sections.

Further, one of the cover plates can have a variable material thickness in one or both extension directions.

An advantageous design of the cover plate can be achieved via a variable material thickness. In particular the temperature homogeneity across the cover plate can be improved thereby. The extension directions of the cover plate coincide thereby with the spatial directions.

It can be advantageous, further, if the cover plate has its maximum material thickness in the areas of the contact surfaces with the Peltier elements.

Because the greatest heat input occurs particularly in the areas of the contact surfaces, it is especially advantageous to make the material thickness maximal there.

An exemplary embodiment can have web-like elements, which increase the stability of the cover plate particularly in areas of lower material thickness, are provided between the areas of maximum material thickness.

These web-like elements increase the stiffness of the cover plate, which is, reduced in part by the reduction of the material thickness.

The expansion joints and/or the spring structures can be arranged in areas of lower material thickness.

This is especially advantageous, because the neutral fibers in regard to the thermal stresses are located especially in the areas of low material thickness.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
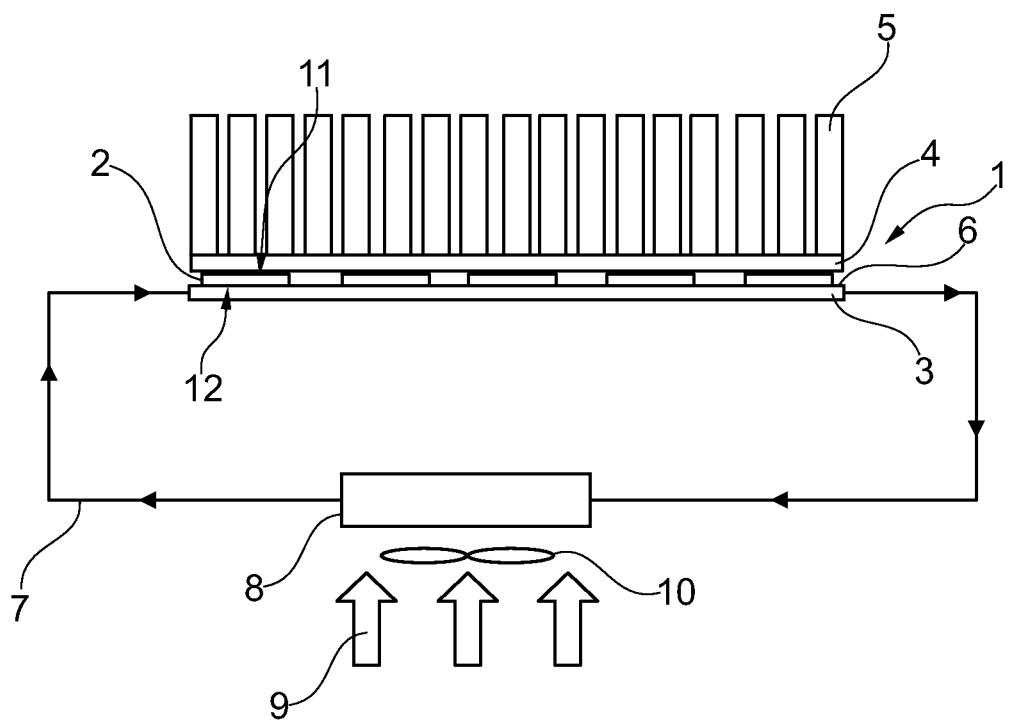
FIG. 1 shows a schematic view of a thermoelectric temperature control unit, whereby the thermoelectric temperature control unit is connected to a fluid circuit, over which heat can be transported away or supplied.

FIG. 1 shows a schematic view of a thermoelectric temperature control unit 1. In FIG. 1, thermoelectric temperature control unit 1 is shown in one section and because only the principle of thermoelectric temperature control unit 1 is to be illustrated, it is not shown completely.

A plurality of battery elements 5, which are to be temperature controlled by thermoelectric temperature control unit 1, is arranged above thermoelectric temperature control unit 1. A battery element 5 can be formed here by a single or a plurality of individual battery cells. Thermoelectric temperature control unit 1 is formed substantially of a plurality of Peltier elements 2, which are capable of transferring heat from one of the outer surfaces thereof to the opposite outer surface by the application of a voltage. Battery elements 5 can thereby either be cooled or heated. Heat can be supplied or removed via fluid circuit 7.

To this end, a first surface 12 of Peltier elements 2 is in thermal contact with a flow channel of a heat exchanger 6. Heat exchanger 6 in this case forms an interface to fluid circuit 7 and can be formed, for example, by a tube through which fluid flows. The connection of first surfaces 12 to heat exchanger 6 in the exemplary embodiment, shown in FIG. 1, occurs via a cover plate 3, which is arranged as an intermediate element between the flow channels of heat exchanger 6 and Peltier elements 2.

Alternatively, the thermally conductive connection can also be made directly with the heat exchanger by placing the Peltier elements without an intermediate element on the heat exchanger flow channels.

Second surface 11, opposite to first surface 12, of Peltier elements 2 is in thermal contact with a further cover plate 4. A plurality of battery elements 5 is arranged above cover plate 4. The heat radiated by battery elements 5 is conveyed by Peltier elements 2 to the contact points of Peltier elements 2 with fluid circuit 7 and there released to the fluid flowing in fluid circuit 7. In a heating mode, heat would be transferred accordingly from fluid circuit 7 to battery elements 5. The heat from fluid circuit 7 can thereby be intensified further by the heat output of Peltier elements 2.

The amount of heat released to the fluid in fluid circuit 7 is then released to the environment via a heat exchanger 8, which is supplied with a current of air 9 by a fan 10. The structure of fluid circuit 7 and the components contained therein outside thermoelectric temperature control unit 1 are not the subject of the invention and therefore are not described further in detail.

Figure 2:
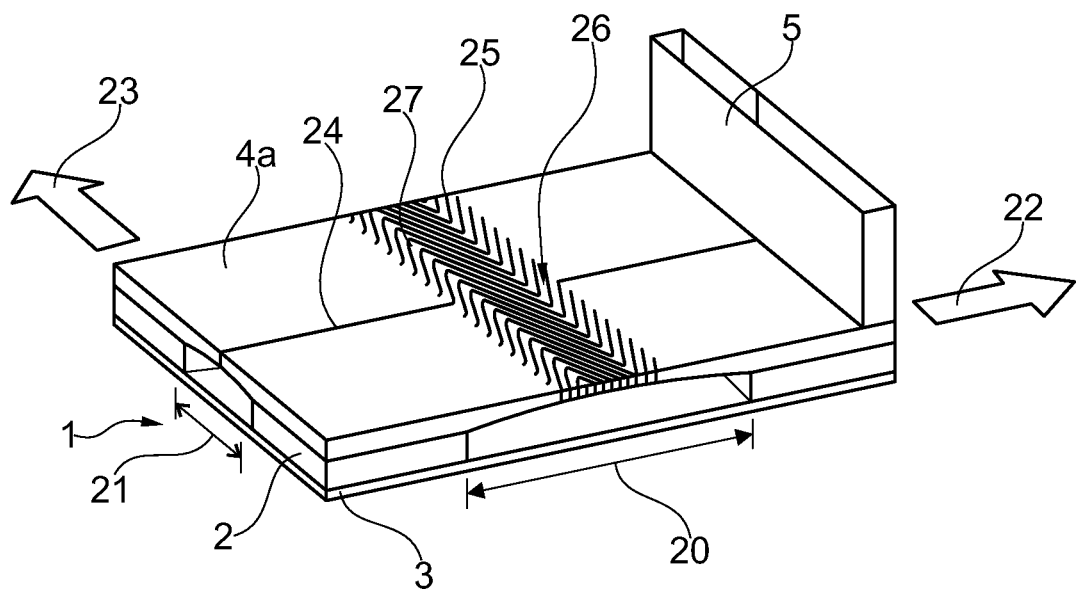
FIG. 2 shows a perspective view of a thermoelectric temperature control unit with a top cover plate, which provides an expansion joint and a spring structure.

FIG. 2 shows a perspective view of a thermoelectric temperature control unit 1, whereby only a section of thermoelectric temperature control unit 1 is shown. The view here shows the smallest possible section such that at least two Peltier elements 2 are adjacent in each spatial direction 22, 23. Peltier elements 2 were cut in their symmetry axes based on spatial direction 22 and 23, so that in each case only a fourth of each Peltier element 2 is depicted. Because of the symmetrical structure of the depicted section, the shown arrangement can be continued in both spatial directions 22 and 23 [and] repeated as often as desired. Thermoelectric temperature control unit 1, as already described in FIG. 1, is formed by a top cover plate 4a and a bottom cover plate 3, between which a plurality of Peltier elements 2 is arranged. Peltier elements 2 are spaced apart relative to one another along spatial direction 22 by distance 20. Furthermore, Peltier elements 2 are spaced apart relative to one another along spatial direction 23 by distance 21.

Spatial directions 22 or 23 represent the directions in which the thermal stresses essentially act that may arise during operation of thermoelectric temperature control unit 1.

Top cover plate 4a has an expansion joint 24. It runs along spatial direction 22. Expansion joint 24 in this case runs in an area which runs between Peltier elements 2. Expansion joint 24 is therefore arranged outside the contact surfaces formed between Peltier elements 2 and cover plate 4a. As can be seen in FIG. 2, expansion joint 24 is arranged in the distance, labeled with reference character 21, along spatial direction 23 between Peltier elements 2.

Furthermore, cover plate 4a has a spring structure 25 which runs substantially along spatial direction 23. Spring structure 25 thereby runs in an area which is designated by distance 20 and lies between Peltier elements 2. Spring structure 25 is thereby formed by a plurality of cuts 26, which are introduced by means of a suitable process, such as, for example, laser cutting, in top cover plate 4a.

In the exemplary embodiment of FIG. 2, the individual cuts 26 are formed by a point symmetric wavy line. These point symmetric wavy lines are arranged parallel to one another along an imaginary straight line. In this regard, in particular the point of symmetry around which cuts 26 are point symmetric lies on the imaginary straight line, running along spatial direction 23, in the central area of spring structure 25.

Both expansion joint 24 and the imaginary straight line within spring structure 25 run along a thermal neutral fiber, which arises in cover plate 4a because of the heat distribution. This is the basis for the arrangement of expansion joint 24 or spring structure 25 in the middle between the respective Peltier elements 2.

Because of the plurality of cuts 26 parallel to one another, a spring web 27 arises between two adjacent cuts 26. The spring web offers the possibility of expanding or compressing cover plate 4a particularly in the direction of spatial direction 22, without permanent deformations of cover plate 4a resulting. Peltier elements 2, which preferably are connected via a rigid connection to cover plate 4a, are further unburdened by the taking up of changes in length within spring structure 25. Expansion joint 24 along spatial direction 23 assumes a similar function.

Expansion joint 24, as is evident in FIG. 2, runs through spring structure 25 and forms one of the cuts 26. In alternative embodiments, the expansion joint can also be formed such that it is not part of the spring structure.

The design of cuts 26 in FIG. 2 is an example and is not limiting in nature. The cuts can also be formed by cuts, for example, shaped like a semicircular arch or with a zigzag or diamond or box shape.

A battery element 5 is arranged on the top side of cover plate 4a. It is oriented transverse to expansion joint 24. In FIG. 2, for the sake of clarity, only one battery element 5 is indicated, whereby a plurality of battery elements 5 can also be provided in an embodiment of the invention.

Figure 3:
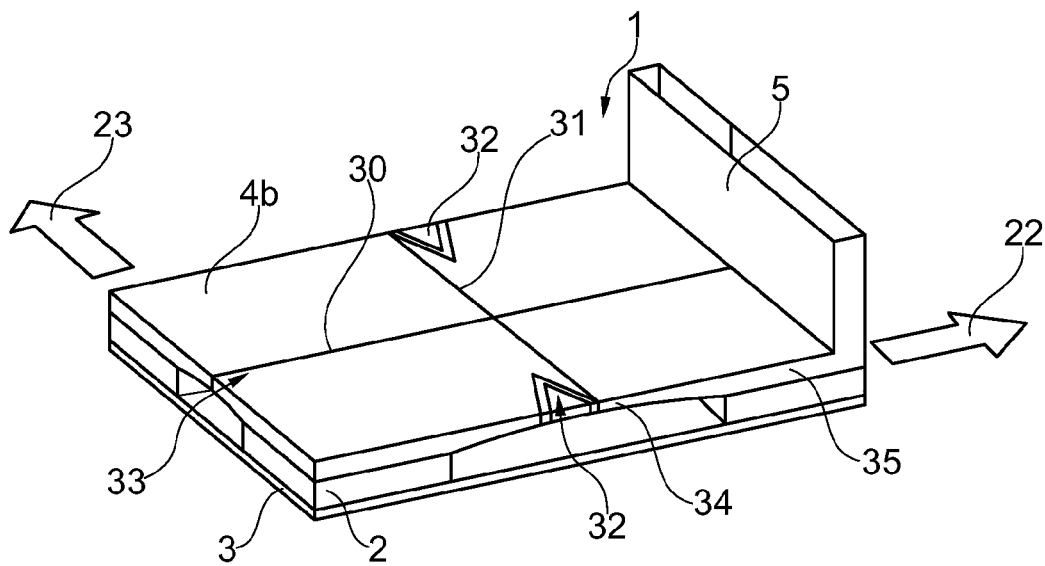
FIG. 3 shows an alternative embodiment of the top cover plate of a thermoelectric temperature control unit according to FIG. 2.

FIG. 3 shows an alternative embodiment of a thermoelectric temperature control unit 1. The shown section is delimited similar to FIG. 2 and because of the symmetric structure can be continued repeating in both spatial directions 22 and 23. In this case the basic structure corresponds substantially to that of FIG. 2. The reference characters also correspond provided that identical elements are used. Top cover plate 4b is designed differently from FIG. 2.

Top cover plate 4b has expansion joints 30 and/or 31 running at a right angle to one another. In this case, expansion joint 30 runs along spatial direction 22 and expansion joint 31 along spatial direction 23. Expansion joint 31 is interrupted at the outer edges of the illustrated section of cover plate 4b by a spring structure 32. Expansion joint 30 is interrupted at the outer edges of the shown section of cover plate 4b by spring structures 33.

As was already evident in the case of cover plate 4a in FIG. 2, cover plate 4b also has a nonuniform material thickness along spatial direction 22 or 23. Cover plate 4b, which with respect to the material thicknesses corresponds to cover plate 4a, has areas 35 of maximum material thickness in the area of the contact surfaces between cover plate 4b and Peltier elements 2. Cover plate 4b has an area of minimal material thickness 34 particularly between Peltier elements 2 in the area in which expansion joints 30 or 31 are located.

This design of cover plate 4b helps particularly in achieving a balanced temperature homogeneity on the top side of cover plate 4b. This should be achieved with the smallest possible installation space or material requirement. Because in particular the greatest amount of heat is transferred through cover plate 4b via Peltier elements 2, the maximum material thickness occurs particularly in the area of the contact surfaces to Peltier elements 2, as shown in areas 35.

The areas with a lower material thickness 34 are usually supplied with a lower heat transmission than areas 35 directly over Peltier elements 2. Therefore, cover plate 4b can be designed with lower material thicknesses in this area 34. Overall, therefore, a homogeneous heat distribution is achieved over cover plate 4b.

Figure 4:
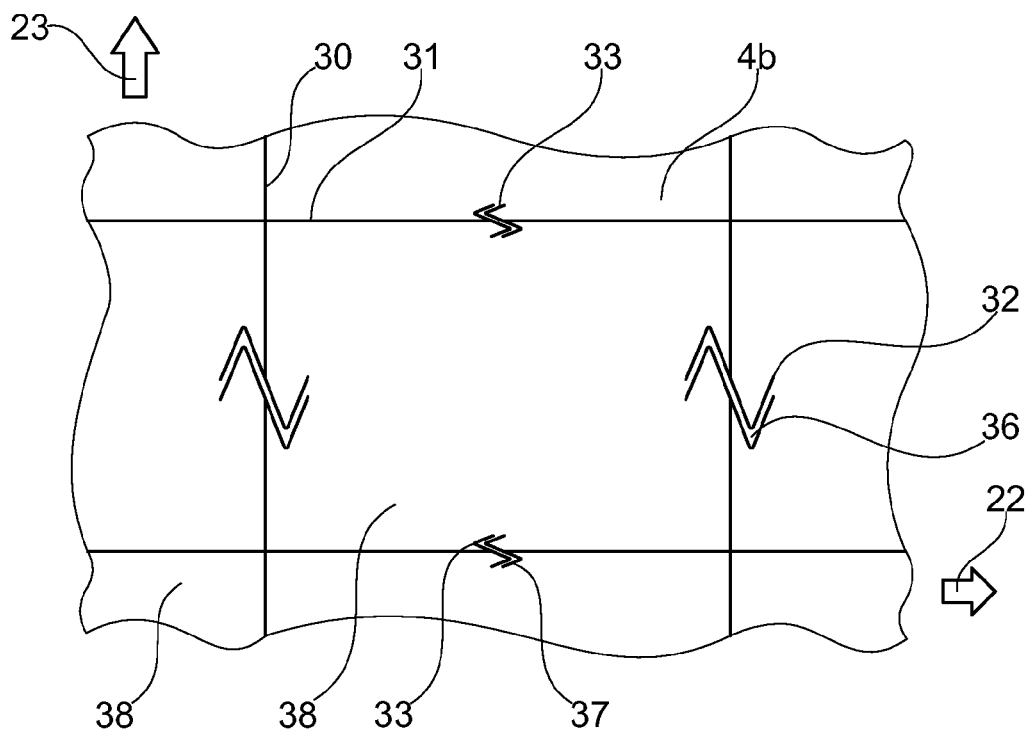
FIG. 4 shows a view of the top cover plate of the thermoelectric temperature control unit of FIG. 3.

FIG. 4 shows a view of cover plate 4b, as it is depicted in FIG. 3. Expansion joints 30 or 31 can be seen, which run at a right angle to one another and along spatial directions 22, 23. Each of expansion joints 30, 31 is interrupted by a spring structure 32, 33. Spring structures 32, 33 are formed of different sizes in FIG. 4. The different size of spring structures 32, 33 is exemplary in this regard.

Spring structures 32, 33 are each formed of two individual cuts, which basically correspond to the shape of cuts 26 of FIG. 2. A spring web 36 is formed by the two cuts in the case of spring structures 32 and a spring web 37 is formed in the case of spring structures 33. Adjacent sections 38 along spatial direction 22 are connected to one another via spring webs 36. Sections 38 are formed here by expansion joints 30 or 31, which divide cover plate 4b into a number of sections 38. Sections 38 adjacent to one another along spatial direction 23 are connected together via spring web 37.

This concept of expansion joints, which are arranged at a right angle to one another and are interrupted by individual spring structures 32, 33, is particularly advantageous, because a cover plate 4b, which has both a high absorbing capacity in regard to thermal stresses in spatial directions 22, 23 and at the same time is easy to produce, can be designed structurally simple in this way.

In particular, a design without spring structures 32, 33 would entail great effort to orient the individual sections 38 against one another. In addition, the stability of such a cover plate would not be optimal.

The stability of cover plate 4b is increased overall by the connection of the individual adjacent sections 38 by spring webs 36, 37 and further simplifies the production and assembly process. Expansion joints 30, 31 and the cuts of spring structures 32, 33 can be advantageously introduced in plate 4b by a method such as laser cutting.

The spring structures shown in FIGS. 2 to 4 are each designed such that the thermal stresses arising during operation result only in a deformation of the material in the area of fatigue strength. The particular cover plate 4a, 4b is not permanently deformed or damaged by repeated expansion or compression of spring structures 25, 32, 33. The stiffness of spring structures 25, 32, 33 can be achieved by a variation, for example, of the set angle of the cuts, the width of the spring webs 27, 36, 37, or generally by the shaping of cuts 26.

A design of cuts 26, as they are shown in FIGS. 2 to 4, is particularly advantageous because the cut is formed point symmetric. This is particularly advantageous with respect to the expansion and compression along spatial directions 22 or 23. In addition, an unintentional excursion of spring webs 27, 36, 37 in the direction of bottom cover plate 3 is prevented by the point symmetric design of cuts 26. Overall, the width of expansion joints 24, 30, 31 should be selected as small as possible in order to assure, if possible, an uninterruptible connection of the battery elements.

The width of cuts 26 should also be as small as possible. However, the cuts should have a certain minimum width in order to provide a sufficient absorbing capacity for changes in length. If the cut width is too small, it can happen that spring webs 27, 36, 37 adjacent to one another impede each other in accommodating a linear expansion.

In particular, by an expansion in the width of spring structures 25, 32, 33, it can furthermore be achieved that a plurality of battery elements 5 is arranged on spring structures 25, 32, 33. In this way, interruptions, which invariably arise due to cuts 26, are distributed among a number of battery elements 5, as a result of which the heat transfer is homogenized overall.

In the design of spring structures 32, 33 of cover plate 4b it is advisable in particular to select an increased width for the cuts. This is especially advantageous, because the area adjacent to spring webs 36, 37 of cover plate 4b deforms only slightly or not at all. For this reason, the excursion of spring webs 36, 37 in this area becomes greater. A broader design of the cuts therefore enables a greater free relative movement of spring webs 36, 37.

Expansion joints 24, 30, 31 shown in FIGS. 2 to 4 can be designed in alternative embodiments, for example, also in a zigzag shape. This will allow for the breaks, achieved by expansion joints 24, 30, 31, to be divided among a plurality of battery elements 5. This is particularly helpful for the homogeneity of the temperature distribution across cover plate 4a, 4b.

Figure 5:
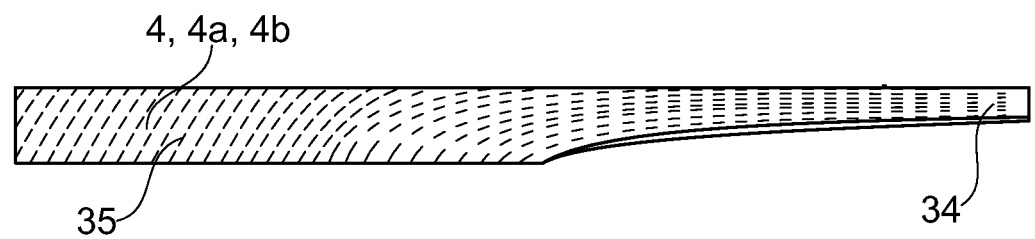
FIG. 5 shows a partial view of a top cover plate with a nonuniform material thickness.

FIG. 5 shows a partial section of cover plate 4, 4a, 4b. Particularly in this partial section of FIG. 5 it can be seen that there is an area of maximum material thickness 35 and an area of minimal material thickness 34. The area of maximum material thickness 35 is particularly the area of contact with the Peltier elements. The expansion joints or the spring structures are preferably arranged in the area of minimal material thickness 34.

The transition between minimal area 34 and maximum area 35 is shown as smooth as possible and without sharp shoulders and edges. Ideally, no radii of curvature smaller than 10 mm should be provided for the design of the transitions. Dispensing with sharp edges, shoulders, and corners is particularly advantageous with respect to the homogeneous temperature distribution across cover plate 4, 4a, 4b, which is illustrated by the shown vector field of the heat current.

Figure 6:
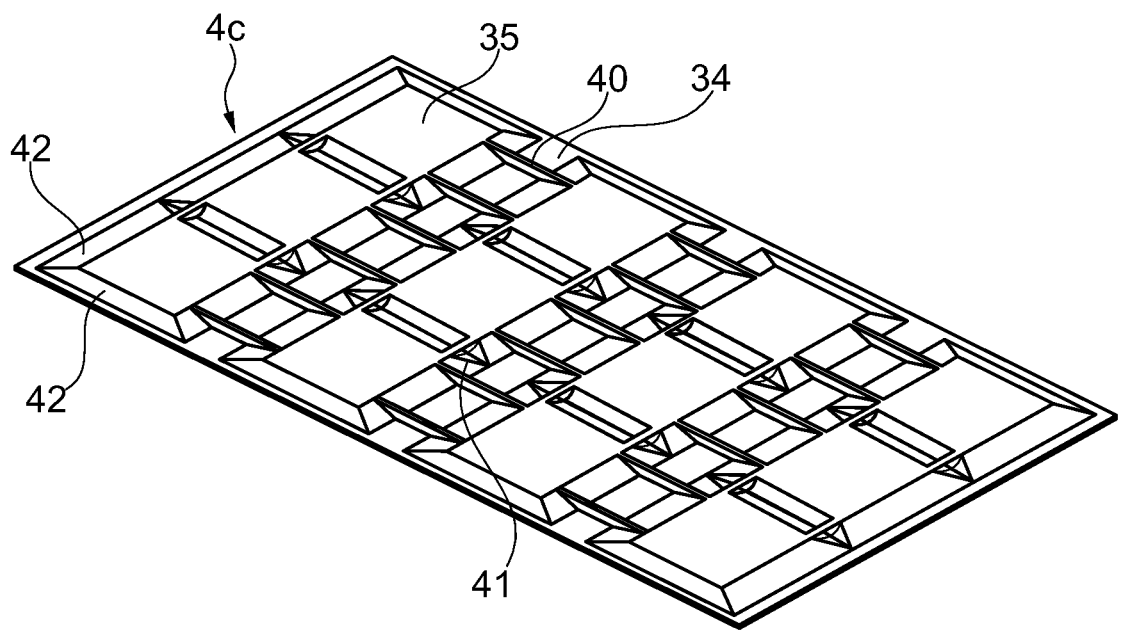
FIG. 6 shows a perspective view of a cover plate, whereby the cover plate has areas of different material thicknesses and web-like elements are provided between the areas of maximum material thickness.

FIG. 6 shows a further alternative embodiment of a cover plate 4c. FIG. 6 shows a view of the bottom side of cover plate 4c, with which the Peltier elements can be connected. Areas 35 with the maximum material thickness and areas 34 with the minimal material thickness are especially evident. In the exemplary embodiment of FIG. 6, 12 areas of maximum material thickness 35 are arranged in a four by three grid and used to connect a Peltier element 2. Transition areas 42, which, similar to the profile shown in FIG. 5, lead from the area of maximum material thickness 35 to the area of minimal material thickness 34, are arranged between the areas of maximum material thickness 35 and the areas of minimal material thickness 34.

A plurality of web-like elements 40 are arranged between the areas of maximum material thickness 35 in a spatial direction. Web-like elements 41 are arranged in the other spatial direction between the areas of maximum material thickness 35. Said web-like elements 40 or 41 serve to compensate for the loss in stiffness, which is caused by the reduced material thickness 34 in cover plate 4c. By means of web-like elements 40 or 41, plate 4c can achieve a similar basic stiffness as a plate that does not have different material thicknesses. Web-like elements 40, 41 can be formed over the full height of the depressions between areas 35 of maximum material thickness or only over a portion of this height.

It can be seen especially in the areas bridged by web-like elements 41 that the transitions run without sharp edges from the areas of maximum material thickness 35 to the areas of minimal material thickness 34. As already indicated in FIG. 5, all transitions are rounded off and have no radii of curvature smaller than 10 mm.

Areas 35 of maximum material thickness are formed as platform-like areas. The upwardly directed surface of the platform-like areas is square. Said surface is advantageously adapted to the shape of the employed Peltier elements.

Cover plate 4c shown in FIG. 6, like the previous cover plates 4a and 4b, can have expansion joints or spring structures on the side facing away from the viewer.

Figure 7:
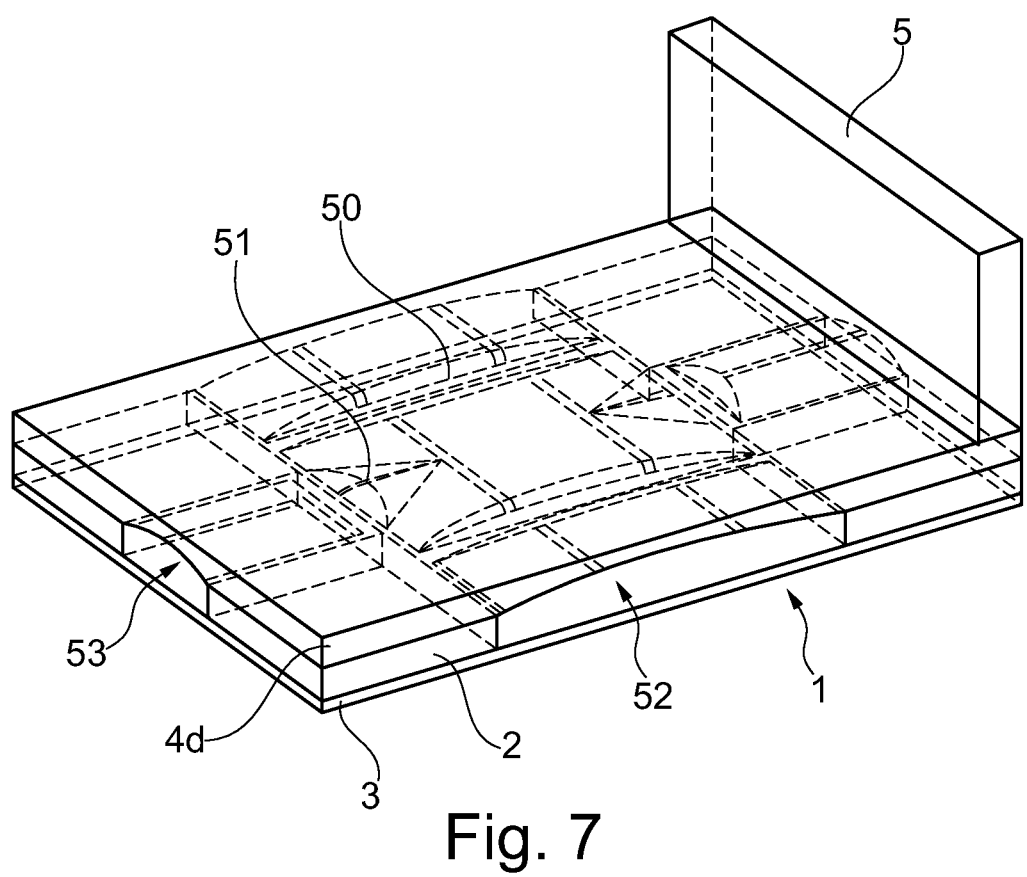
FIG. 7 shows a perspective view of a thermoelectric temperature control unit, whereby a cover plate with a nonuniform material thickness is used.

FIG. 7 shows a further alternative exemplary embodiment of a thermoelectric temperature control unit 1. Thermoelectric temperature control unit 1 of FIG. 7 has a cover plate 4d. It is formed analogous to cover plate 4c, as it was shown in FIG. 6. No expansion joints or spring structures are provided on the surface of cover plate 4d. These can likewise be provided, however, in alternative embodiments as shown in FIGS. 2 to 4. Cover plate 4d is formed such that channels 52 or 53 running between Peltier elements 2 have a basic profile, which runs linearly downward toward cover plate 3 and is arc-shaped upward toward cover plate 4d.

Two web-like elements 51 are arranged along channel 52. These serve to increase the stiffness of cover plate 4d. Funnel-shaped transitions 51, which arise from the radii of curvature of channels 52 or 53, are provided along narrower channel 53 particularly at the intersection with channel 52.

In alternative embodiments, web-like elements can also be provided within channels 53. A battery element 5 is likewise indicated on the top side of cover plate 4d.

A cover plate with a high temperature homogeneity can be achieved in particular by a design of cover plate 4d. The temperature distribution can be influenced by different material thicknesses. The different material thicknesses, moreover, already offer an improved possibility for absorbing thermal stresses, because a different strength of the individual areas is also associated with the different material thicknesses. In addition, the absorbing capacity for thermal stresses of cover plate 4d can be increased further by the provision of expansion joints and spring structures, as they were already shown in FIGS. 2 to 4.

The individual features of the exemplary embodiments of FIGS. 1 to 7 can also be combined with one another. The shown exemplary embodiments are not limiting in nature. This applies especially to parameters such as the geometric design, size, and material selection, as well as the number of Peltier elements in spatial direction 22 and/or in spatial direction 23. FIGS. 1 to 7 are exemplary in nature and are used to clarify the inventive concept. They are not meant to be restrictive.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A thermoelectric temperature control unit comprising:
a first Peltier element; and
a second Peltier element, each of the first and second Peltier elements have a first surface and a second surface, the first surface being arranged adjacent or opposite to the second surface, the first and second Peltier elements each being connected with the first surface to a first cover plate and are connected with the respective second surface to a second cover plate,
whereby heat is configured to be supplied at least via one of the cover plates and heat is removed via the other cover plate,
wherein at least one of the first or the second cover plate have at least one of an expansion joint or a spring structure, and
wherein one of the cover plates has a variable material thickness in one or both extension directions.

2. The thermoelectric temperature control unit according to claim 1, wherein the Peltier elements are arranged spaced apart from one another between the first and second cover plates.

3. The thermoelectric temperature control unit according to claim 1, wherein the at least one of the expansion joint or the spring structure in the at least one of the first cover plate or the second cover plate run outside the contact surfaces between the Peltier elements and the respective cover plate.

4. The thermoelectric temperature control unit according to claim 1, wherein the first or second cover plate has a plurality of the at least one of the expansion joints or spring structures.

5. The thermoelectric temperature control unit according to claim 1, wherein the spring structure is formed by a plurality of wave-like cuts, and wherein the wave-like cuts are substantially point symmetric and are arranged with their symmetry point parallel to one another along a mutual straight line.

6. The thermoelectric temperature control unit according to claim 1, wherein the first or second cover plate have at least two expansion joints and spring structures and wherein the expansion joints run substantially parallel to one another and run at substantially right angles to the respective spring structures.

7. The thermoelectric temperature control unit according to claim 1, wherein the one cover plate has its maximum material thickness in the areas of the contact surfaces with the first or second Peltier elements.

8. The thermoelectric temperature control unit according to claim 7, wherein web-like elements, which increase stability of the cover plate in areas of low material thickness, are provided between the areas of maximum material thickness.

9. The thermoelectric temperature control unit according to claim 1, wherein the at least one of the expansion joints or the spring structures are arranged in areas of lower material thickness.

10. A thermoelectric temperature control unit comprising:
a first Peltier element; and
a second Peltier element, each of the first and second Peltier elements have a first surface and a second surface, the first surface being arranged adjacent or opposite to the second surface, the first and second Peltier elements each being connected with the first surface to a first cover plate and are connected with the respective second surface to a second cover plate,
whereby heat is configured to be supplied at least via one of the cover plates and heat is removed via the other cover plate,
wherein at least one of the first or the second cover plate have an expansion joint and a spring structure, and
wherein the spring structure is formed by an arrangement of a plurality of cuts in the at least one of the first or second cover plates, and wherein at least one spring web is formed by the cuts.

11. The thermoelectric temperature control unit according to claim 10, wherein at least one of the cuts of the spring structure is formed by the expansion joint.

12. A thermoelectric temperature control unit comprising:
a first Peltier element; and a second Peltier element, each of the first and second Peltier elements have a first surface and a second surface, the first surface being arranged adjacent or opposite to the second surface, the first and second Peltier elements each being connected with the first surface to a first cover plate and are connected with the respective second surface to a second cover plate, whereby heat is configured to be supplied at least via one of the cover plates and heat is removed via the other cover plate, wherein at least one of the first or the second cover plate have at least one of an expansion joint or a spring structure, and wherein the first or second cover plate is in thermal contact with at least one battery element, wherein the respective other cover plate is in thermal contact with a heat exchanger, and wherein an actively temperature-controllable fluid flows through the heat exchanger.

13. A thermoelectric temperature control unit comprising:
a first Peltier element; and
a second Peltier element, each of the first and second Peltier elements have a first surface and a second surface, the first surface being arranged adjacent or opposite to the second surface, the first and second Peltier elements each being connected with the first surface to a first cover plate and are connected with the respective second surface to a second cover plate, whereby heat is configured to be supplied at least via one of the cover plates and heat is removed via the other cover plate, wherein at least one of the first or the second cover plate have at least two expansion joints and a spring structure, and wherein the at least one of the first or second cover plate is divided into a plurality of sections by the at least two expansion joints arranged at substantially right angles to one another, and wherein the first and second Peltier elements are connected to each of the sections.

14. The thermoelectric temperature control unit according to claim 13, wherein at least one of the at least two expansion joints is interrupted by a spring web of the spring structure, and wherein two sections, arranged adjacent to one another, are connected to one another by the spring web.

* * * * *